United States Patent
Chen

(10) Patent No.: US 11,004,501 B2
(45) Date of Patent: May 11, 2021

(54) SENSING A MEMORY DEVICE

(71) Applicant: Macronix International Co., Ltd., Hsinchu (TW)

(72) Inventor: Chung-Kuang Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 16/453,633

(22) Filed: Jun. 26, 2019

(65) Prior Publication Data

US 2020/0411077 A1 Dec. 31, 2020

(51) Int. Cl.
| | | |
|---|---|---|
| *G11C 16/26* | (2006.01) | |
| *G11C 11/4091* | (2006.01) | |
| *G11C 11/4099* | (2006.01) | |
| *G11C 11/56* | (2006.01) | |

(52) U.S. Cl.
CPC ...... *G11C 11/4091* (2013.01); *G11C 11/4099* (2013.01); *G11C 11/5628* (2013.01); *G11C 2211/4013* (2013.01)

(58) Field of Classification Search
CPC .............................. G11C 16/0483; G11C 16/26
USPC ......................... 365/185.17, 185.21, 185.22
See application file for complete search history.

(56) References Cited

U.S. PATENT DOCUMENTS

| | | | |
|---|---|---|---|
| 9,589,610 B1* | 3/2017 | Chen | ................. G11C 7/12 |
| 10,263,529 B2 | 4/2019 | Sandusky et al. | |
| 2009/0244978 A1* | 10/2009 | Yoshihara | .......... G11C 16/0483 365/185.21 |

FOREIGN PATENT DOCUMENTS

| | | |
|---|---|---|
| CN | 1240290 | 1/2000 |
| TW | 201419280 | 5/2014 |
| TW | 201601682 | 1/2016 |
| TW | 201711036 | 3/2017 |

OTHER PUBLICATIONS

Irwin et al., Basic Engineering Circuit Analysis, Jan. 2015, vol. 11 Chapter 2, Section 2.2, pp. 30-31 (Year: 2015).*

* cited by examiner

*Primary Examiner* — Alfredo Bermudez Lozada
(74) *Attorney, Agent, or Firm* — Fish & Richardson P.C.

(57) ABSTRACT

A memory device comprises a memory cell array with memory cells arranged in a cell string coupled to a metal bit line, a sense amplifier for providing a sensing current to the memory cell array, and a memory controller for controlling the sense amplifier to provide the sensing current to access data during a memory access cycle. The memory controller performs operations comprising: during a pre-charging stage of the memory access cycle, providing a pre-charging voltage to the sense amplifier to drive the sense amplifier such that a particular voltage is provided to the memory cell array; during a first sensing stage, providing the pre-charging voltage to the sense amplifier; and during a second sensing stage, providing a sensing voltage to drive the sense amplifier such that the particular voltage provided to the memory cell array is maintained.

23 Claims, 6 Drawing Sheets

SENSING A MEMORY DEVICE

TECHNICAL FIELD

The present application relates to a memory device. In particular, the present application relates to sensing memory cells in a memory device.

BACKGROUND

Memory cells can be sensed by applying a set of voltages during a sensing cycle. To sense data from a high-density memory device, e.g., a high-density NAND flash memory device, different levels of voltages can be applied to the high-density memory device at different timings for suitable periods.

SUMMARY

The present application describes techniques and systems directed towards sensing data from memory cells in a memory device. In some implementations, where a memory cell array of the memory device has parasitic capacitance, e.g., corresponding to a metal bit line (MBL), sensing current provided from a sense amplifier of the memory device can be provided to the parasitic capacitance (also referred to as "capacitance unit"), the one or more memory cells, or both. The sensing current is provided to the capacitance unit as channel current and to the memory cells as cell current. In some cases, a voltage difference at an output node of the sense amplifier during a transition from a pre-charging operation to a sensing operation can cause channel current, such that the amount of sensing current is not adequate for accurate sensing operations. In such cases, the memory controller pre-charges the metal bit line parasitic capacitance using a pre-charging current, such that, when performing sensing operations to read data from memory cells, the channel current is reduced or eliminated, while most of the sensing current is provided as cell current that is used for sensing data from memory cells. In this manner, by distributing more of the sensing current as cell current rather than channel current, accurate sensing operation can be performed, mitigating the negative impact of the voltage difference at the output node of the sense amplifier.

The disclosed techniques and systems can reduce or substantially eliminate the voltage difference at the output node of the sense amplifier. In some implementations, the memory controller applies different levels of voltages at appropriate timings for suitable periods during pre-charging and sensing operations to reduce or eliminate the voltage difference at the output node of the sense amplifier, thereby reducing or eliminating the channel current. As a result, the techniques can improve the efficiency of the sensing operations by allowing the sensing current provided to the memory cell array being used for cell current rather than channel current.

The disclosed techniques improve the sensing accuracy of a sense amplifier for doing parallel operations of pre-charging a metal bit line of a memory cell array and sense amplifier latch operation. The sensing noise is decreased by decreasing the metal bit line charging current during the sensing timing, such that the sensing current is used mostly for the cell current, thereby improving the sensing accuracy for a memory cell. This is useful to implement faster dense memory devices, such as memory devices with triple-level cells (TLC) and quad-level cells (QLC), and particularly for lower reference sensing current.

In general, one innovative aspect of the subject matter described in this specification can be implemented in a memory device that comprises a memory cell array including a plurality of memory cells arranged in a cell string that is coupled to a metal bit line, a sense amplifier for providing a sensing current to the memory cell array, and a memory controller for controlling the sense amplifier to provide the sensing current to one or more memory cells of the plurality of memory cells to access data from the one or more memory cells during a memory access cycle. The memory controller performs operations comprising: during a pre-charging stage of the memory access cycle, providing a pre-charging voltage to the sense amplifier to drive the sense amplifier such that a particular voltage is provided to the memory cell array; during a first sensing stage of the memory access cycle, providing the pre-charging voltage to the sense amplifier; and during a second sensing stage of the memory access cycle, providing a sensing voltage to the sense amplifier to drive the sense amplifier such that the particular voltage provided to the memory cell array is maintained, wherein the pre-charging voltage is higher or lower than the sensing voltage.

The foregoing and other implementations can each optionally include one or more of the following features, alone or in combination. In particular, one implementation includes all the following features in combination. The one or more memory cells of the plurality of memory cells may receive a first current from the sense amplifier. The memory cell array may further comprise a capacitance circuit corresponding to the metal bit line that receives a second current from the sense amplifier. A sum of the first current and the second current may be the sensing current.

The memory controller may be configured to control, during the pre-charging stage of the memory access cycle, the sense amplifier to provide the first current to the one or more memory cells of the plurality of memory cells and the second current to the capacitance circuit. During the pre-charging stage of the memory access cycle, the one or more memory cells of the plurality of memory cells may be pre-charged by the first current and the capacitance circuit is pre-charged by the second current.

The capacitance circuit may include a metal bit line parasitic capacitance.

The memory controller may be configured to control, during the second sensing stage of the memory access cycle, the sense amplifier to provide the first current to the one or more memory cells of the plurality of memory cells, and to stop providing the second current to the capacitance circuit. During the second sensing stage of the memory access cycle, the first current may be same as the sensing current.

The sense amplifier may include a pre-charging unit that is configured to generate the second current based on a first control signal and a second control signal that are received from the memory controller. The sense amplifier may also include a sensing unit that is configured to generate the first current based on a third control signal that is received from the memory controller. The pre-charging unit may include a first transistor that is configured to drive a first voltage based on the first control signal that is applied to a gate of the first transistor, and a second transistor that is configured to drive a second voltage based on the second control signal that is applied to a gate of the second transistor, wherein the second current is generated based on the first voltage and the second voltage. The sensing unit may include a third transistor that is configured to drive a third voltage based on the third control signal that is applied to a gate of the third transistor, wherein the first current is generated based on the third voltage.

At least one of the pre-charging stage of the memory access cycle, the first sensing stage of the memory access cycle, or the second sensing stage of the memory access cycle may continue for a preselected time period. The preselected time period may be in the order of several microseconds, e.g., 1-10 microseconds.

The pre-charging voltage may be between 0.5 volts and 1.5 volts, and the sensing voltage may be between 1 volt and 2 volts. The sensing current may correspond to the particular voltage provided from the sense amplifier to the memory cell array.

Another innovative aspect of the subject matter described in this specification can be implemented in a method to program one or more memory cells of a memory device during a memory access cycle, the method comprising: during a pre-charging stage of the memory access cycle, providing, by a memory controller, a pre-charging voltage to a sense amplifier of the memory device, wherein the sense amplifier is driven to provide a particular voltage to a memory cell array of the memory device; during a first sensing stage of the memory access cycle, providing, by the memory controller, the pre-charging voltage to the sense amplifier; and during a second sensing stage of the memory access cycle, providing, by the memory controller, a sensing voltage to the sense amplifier, wherein the sense amplifier is driven to maintain the particular voltage provided to the memory cell array, wherein the pre-charging voltage is higher or lower than the sensing voltage.

The foregoing and other implementations can each optionally include one or more of the following features, alone or in combination. In particular, one implementation includes all the following features in combination. Driving the sense amplifier to provide the particular voltage to the memory cell array of the memory device may comprise providing a first current from the sense amplifier to one or more memory cells in a cell string of the memory cell array further, and providing a second current from the sense amplifier to a parasitic capacitance circuit corresponding to a metal bit line of the memory cell array that is coupled to the cell string, wherein a sum of the first current and the second current is equal to a sensing current of the sense amplifier.

During the second sensing stage of the memory access cycle, the sense amplifier may be controlled to stop providing the second current to the parasitic capacitance circuit, and to provide the first current to the one or more memory cells, wherein the first current is same as the sensing current during the second sensing stage of the memory access cycle.

Providing the first current and the second current may comprise generating, using a pre-charging unit of the sense amplifier, the second current based on a first control signal and a second control signal that are received from the memory controller, and generating, using a sensing unit of the sense amplifier, the first current based on a third control signal that is received from the memory controller.

The sensing current may correspond to the particular voltage provided from the sense amplifier to the memory cell array. At least one of the pre-charging stage of the memory access cycle, the first sensing stage of the memory access cycle, or the second sensing stage of the memory access cycle may continue for a preselected time period. The preselected time period may be in the order of several microseconds, e.g., 1-10 microseconds.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

A memory cell in a memory device can be accessed, e.g., data can be written to, read from, or erased from the memory cell, by applying different voltage levels to the memory cell at different timings for suitable periods during a corresponding operating cycle.

Figure 1:
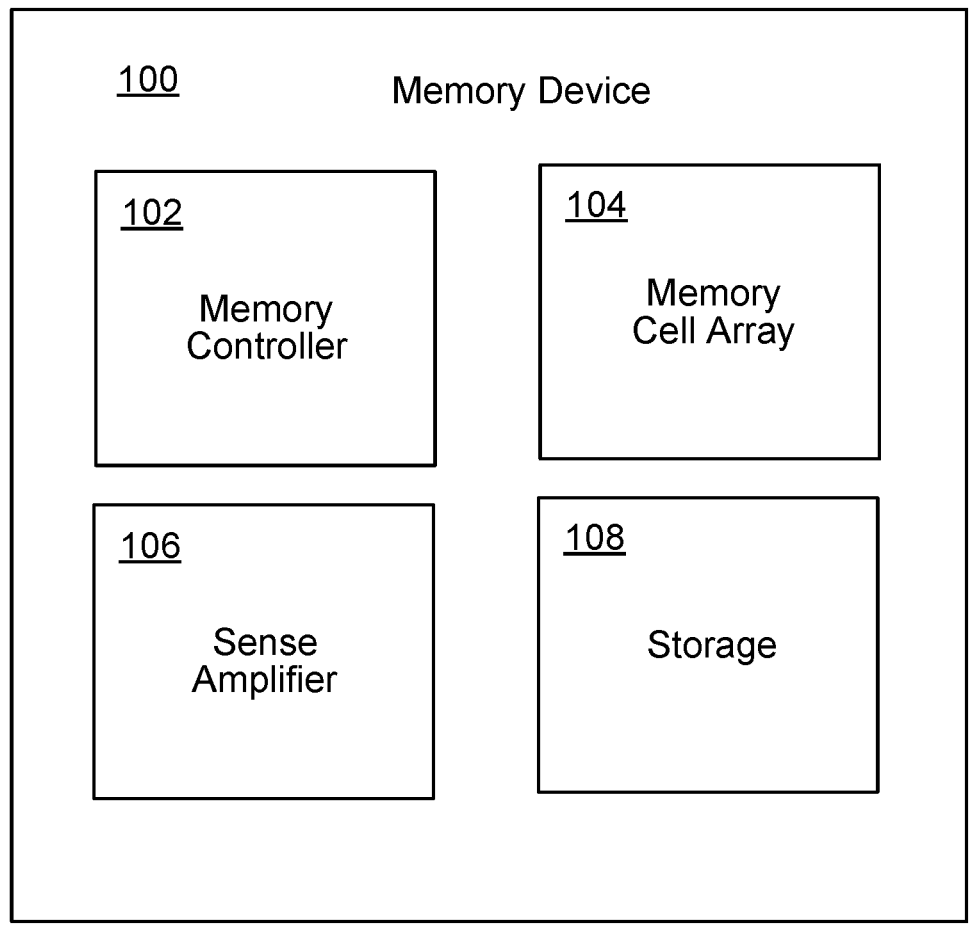
FIG. 1 illustrates an example of a memory device.

FIG. 1 illustrates an example of a memory device 100. The memory device 100 includes a memory controller 102 and a memory cell array 104. The memory controller 102 includes logic to perform various operations, which include accessing the memory cell array 104, e.g., writing to, reading from, or erasing from the memory cell array 104. In some implementations, the memory controller 102 includes one or more processors to access memory cells in the memory cell array 104, where the processors execute operations to access the memory cell array 104. In some implementations, logic corresponding to the operations are stored in a storage coupled to the memory device, e.g., storage 108.

In some implementations, the memory cell array 104 includes one or more memory blocks. Each memory block includes one or more columns, called strings, of memory cells. A string can include a plurality of memory cells. The memory cells can be single-level cells or multi-level cells. In some implementations, the memory cell array 104 includes nonvolatile memory cells, e.g., flash memory cells. The memory cell array 104 can include different types of memory cells including, but not limited to, 2D NAND flash memory cells, 3D NAND flash memory cells comprising U-shaped strings, and 3D NAND flash memory cells comprising non-U-shaped strings. In some implementations, each of the memory blocks includes a single string.

In some implementations, the memory device 100 includes a sense amplifier 106. The sense amplifier 106 provides sensing current to one or more memory cells in the memory cell array 104 and performs operations, e.g., pre-charging or sensing operations, for the memory cell array 104. The sense amplifier 106 provides sensing current to the memory cell array 104 at a particular current level. For example, the sense amplifier 106 can perform drain side bias of a memory cell and provide a cell current that flows from the sense amplifier through memory cell to a common source line (CSL) or ground (GND.) In some implementations, the storage 108 stores data indicating how much sensing current is provided, or how long sensing current is provided, or both. In some implementations, the memory controller 102 controls the memory cell access operations performed by the sense amplifier 106. For example, the memory controller 102 can control the sense amplifier 106 to provide sensing current at a particular current level at a particular timing using control signals. Such access operations performed by the sense amplifier 106 are described in greater detail with reference to FIGS. 2 to 5 below.

In some implementations, the storage 108 stores information for accessing memory cells in the memory cell array 104. The information can include, for example, different voltages levels, or timing data that specifies times during which the different voltage levels are applied to the memory cell array, or both. A variety of formats are possible for the timing data for the different voltage levels applied to the memory cell array, e.g., a start time and an end time for a particular voltage level, or a start time and a duration for the particular voltage level. The storage 108 can be any type of suitable storage. For example, the storage 108 can be a temporary storage, a static random access memory (SRAM), a NAND flash memory, or a set of registers. In some implementations, the storage 108 is implemented as a portion of the memory cell array 104, where the portion can be distinct from the memory cells that are to be programmed.

Figure 2:
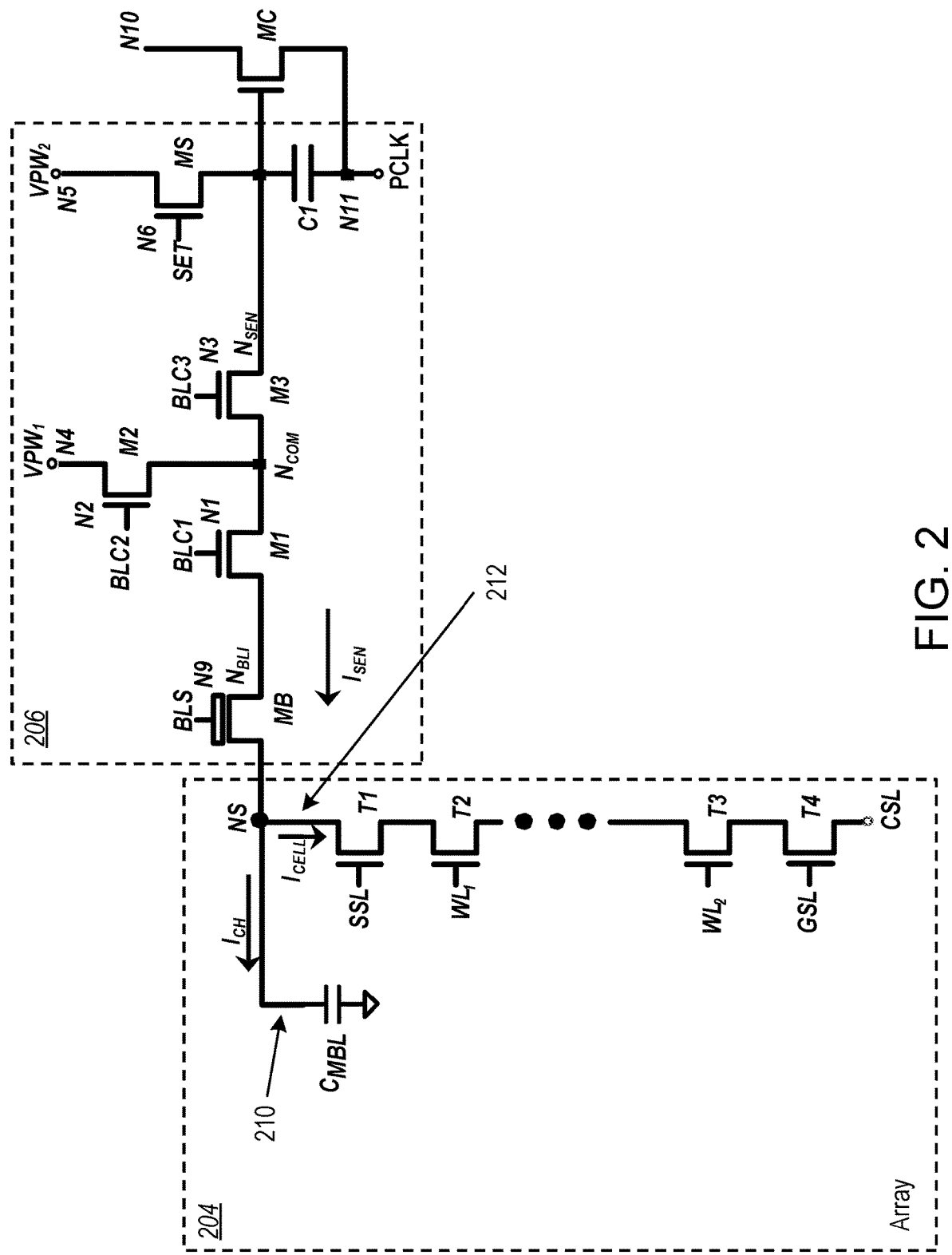
FIG. 2 illustrates an example circuit diagram for a memory cell array and a sense amplifier of a memory device.

FIG. 2 illustrates an example of a circuit diagram for a memory cell array 204 and a sense amplifier 206. In some implementations, the memory cell array 204 and the sense amplifier 206 correspond to the memory cell array 104 and the sense amplifier 106 illustrated in FIG. 1. The memory cell array 204 includes a plurality of memory cell strings, of which one memory cell string 212 is illustrated in FIG. 2. The memory cell array 204 also includes a plurality of metal bit lines, of which one metal bit line (MBL) 210 is illustrated in FIG. 2. The sense amplifier 206 is coupled to the memory cell string 212 and the metal bit line 210 at node NS.

A capacitance $C_{MBL}$ is associated with the metal bit line 210. In some implementations, the capacitance $C_{MBL}$ represents parasitic capacitance formed in the memory cell array 204 corresponding to the metal bit line 210. The sense amplifier 206 provides a sensing current to the memory cell array 204 by setting a bias of the node NS. This sensing current is provided to the memory cell string 212, or the metal bit line 210 or both. In the illustrative example of FIG. 2, cell current $I_{CELL}$ represents current provided to the memory cell string 212 and charging current $I_{CH}$ represents current provided to the capacitance $C_{MBL}$ of the metal bit line 210. That is, the sensing current $I_{SEN}$ can be represented as a sum of the cell current $I_{CELL}$ and the charging current $I_{CH}$:

$$I_{SEN} = I_{CELL} + I_{CH}$$

For conventional memory devices, the capacitance $C_{MBL}$ can have a high value. In such cases, the time taken to pre-charge a metal bit line during a memory access operation (e.g., to set the voltage for a memory cell to the threshold voltage for a read operation) is long due to the time taken to charge $C_{MBL}$, which introduces unwanted delay for the memory access operation. As described in greater detail with reference to FIGS. 3-5 below, the techniques described in this disclosure enable the sense amplifier 206 to perform pre-charging and sensing operations for the memory cell array 204 using the sensing current $I_{SEN}$ in a manner that loads the capacitance $C_{MBL}$ faster than in conventional memory devices, such that the memory access operation is performed accurately while taking less time.

The memory cell string 212 includes a plurality of memory cells, which are realized using multiple transistors, e.g., transistors T1, T2, T3 and T4. The transistors can be of various types including, but not limited to, a bipolar junction transistor, a p-channel Metal Oxide Semiconductor (PMOS) transistor, an n-channel Metal Oxide Semiconductor (NMOS) transistor, a complementary Metal Oxide Semiconductor (CMOS) transistor, or other suitable types of transistors.

As shown in FIG. 2, the transistors T1, T2, T3 and T4 in the cell string 212 are coupled between the node NS and the common source line CSL. The drain of the transistor T1 is coupled to the node NS, the gate of the transistor T1 is coupled to a string select line SSL, and the source of the transistor T1 is coupled to the transistor T2. The transistor T1 is turned on or off based on a voltage provided through the string select line SSL. For example, when a voltage over a threshold voltage of the transistor T1 is provided to the gate of the transistor T1 through the string select line SSL, the transistor T1 is turned on so that current flows from the node NS to the transistor T2.

The drain of the transistor T2 is coupled to the source of the transistor T1, the gate of the transistor T2 is coupled to a word line WL1, and the source of the transistor T2 is coupled to the transistor T3. The transistor T2 is turned on or off based on a voltage provided through the word line WL1. For example, when a voltage over a threshold voltage of the transistor T2 is provided to the gate of the transistor T2 through the word line WL1, the transistor T2 is turned on so that current flows from the transistor T1 to the transistor T3 through the transistor T2.

The drain of the transistor T3 is coupled to the source of the transistor T2, the gate of the transistor T3 is coupled to a word line WL2, and the source of the transistor T3 is coupled to the transistor T4. The transistor T3 is turned on or off based on a voltage provided through the word line WL2. For example, when a voltage over a threshold voltage of the transistor T3 is provided to the gate of the transistor T3 through the word line WL2, the transistor T3 is turned on so that current flows from the transistor T2 to the transistor T4 through the transistor T3.

The drain of the transistor T4 is coupled to the source of the transistor T3, the gate of the transistor T4 is coupled to a global source line GSL, and the source of the transistor T4 is coupled to the common source line CSL. The transistor T4 is turned on or off based on a voltage provided through global source line GSL. For example, when a voltage over a threshold voltage of the transistor T4 is provided to the gate of the transistor T4 through the global source line GSL, the transistor T4 is turned on so that current flows from the transistor T3 to the common source line CSL through the transistor T4.

In some implementations, one or more additional transistors can be coupled between the source of the transistor T2 and the drain of the transistor T3. In these implementations, the gate of each transistor can be respectively coupled to a word line that is coupled to one or more memory cells.

The sense amplifier 206 provides sensing current to the memory cell array 204 based on one or more control signals provided by a memory controller, e.g., the memory controller 102 of FIG. 1 in some implementations. In some implementations, the sense amplifier 206 includes multiple transistors, which can be of various types, such as a bipolar junction transistor, a PMOS transistor, an NMOS transistor, a CMOS transistor, or other suitable types of transistors. For example, as shown in FIG. 2, the sense amplifier 206 includes transistors M1, M2, M3, MB, and MS. A node N4 is coupled to the drain of the transistor M2, a node N2 is coupled to the gate of the transistor M2, and a node $N_{COM}$ is coupled to the source of the transistor M2. In this example, a voltage VPW1 is provided to the node N4 and a bit line clamping signal BLC2 is provided to the node N2. When the bit line clamping signal BLC2 satisfies a threshold voltage of the transistor M2, the transistor M2 is turned on such that the voltage VPW1 is provided to the node $N_{COM}$. In some implementations, the voltage VPW1 can be used to pre-charge the memory cell array 204. In particular, the voltage VPW1 can be used to pre-charge the metal bit line parasitic capacitance $C_{MBL}$ of the memory cell array 204.

A node N5 is coupled to the drain of the transistor MS, a node N6 is coupled to the gate of the transistor MS, and a node $N_{SEN}$ is coupled to the source of the transistor MS. In this example, a voltage VPW2 is provided to the node N5 and a setting signal SET is provided to the node N6. Where the setting signal SET satisfies a threshold voltage of the transistor MS, the transistor MS is turned on such that the voltage VPW2 is provided to the node $N_{SEN}$. In some implementations, the voltage VPW2 can be used to perform sensing operations to the memory cell array 204. In particular, the voltage VPW2 can be provided to the metal bit line 210 of the memory cell array 204.

The node $N_{SEN}$ is coupled to the drain of the transistor M3, a node N3 is coupled to the gate of the transistor M3, and a node $N_{COM}$ is coupled to the source of the transistor M3. In this example, a bit line clamping signal BLC3 is provided to the node N3. Where the bit line clamping signal BLC3 satisfies a threshold voltage of the transistor M3, the transistor M3 is turned on such that the voltage at the node $N_{SEN}$ is provided to the node $N_{COM}$ through the transistor M3.

The node $N_{COM}$ is coupled to the drain of the transistor M1, a node N1 is coupled to the gate of the transistor M1, and a node $N_{BLI}$ is coupled to the source of the transistor M1. In this example, a bit line clamping signal BLC1 is provided to the node N1. Where the bit line clamping signal BLC1 satisfies a threshold voltage of the transistor M1, the transistor M1 is turned on such that the voltage at the node $N_{COM}$ is provided to the node $N_{BLI}$.

The node $N_{BLI}$ is coupled to the drain of the transistor MB, a node N9 is coupled to the gate of the transistor MB, and the node NS is coupled to the source of the transistor MB. In this example, a signal BLS is provided to the node N9. Where the signal BLS satisfies a threshold voltage of the transistor MB, the transistor MB is turned on such that the voltage at the node $N_{BLI}$ is provided to the node NS.

In some implementations, the sense amplifier 206 further includes a transistor MC. A node N10 is coupled to the drain of the transistor MC, the node $N_{SEN}$ is coupled to the gate of the transistor MC, and a node N11 is coupled to the source of the transistor MC. The node N10 can be coupled to a latch unit of a memory device, e.g., the memory device 100 of FIG. 1. Where voltage at the node $N_{SEN}$ satisfies a threshold voltage of the transistor MC, the transistor MC is turned on such that voltage at the node N10 can be provided to the node N11 through the transistor MC. In some implementations, a clock pulse PCLK is provided at the node N11. In some implementations, the sense amplifier 206 further includes a capacitor C1, which is coupled between the node $N_{SEN}$ and the node N11.

Figure 3:
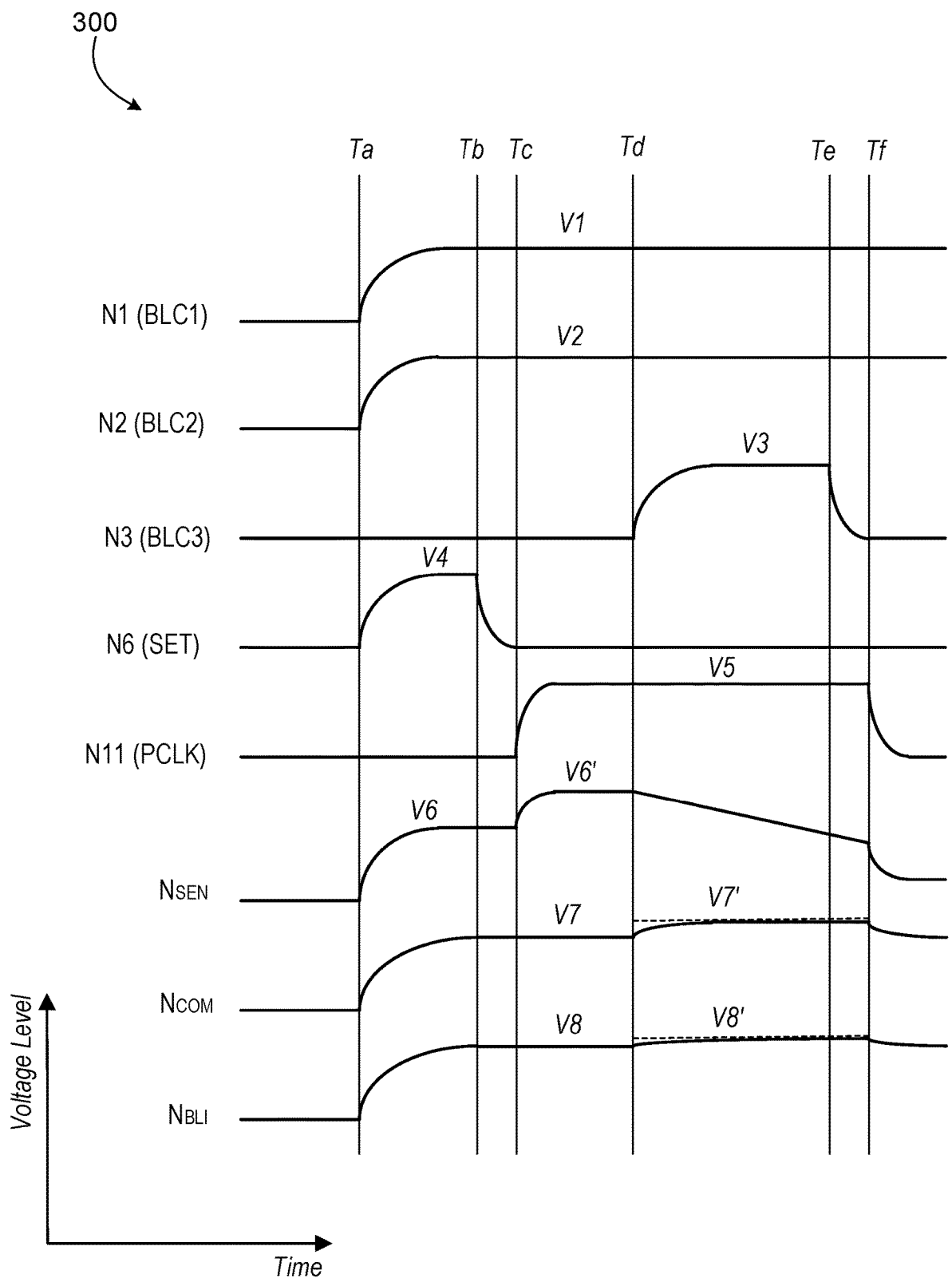
FIG. 3 illustrates a first example timing diagram to perform pre-charging and sensing operations to a memory cell array.

FIG. 3 illustrates a first example timing diagram 300 to perform pre-charging and sensing operations in a memory cell array. In some implementations, the pre-charging and sensing operations indicated by the timing diagram 300 is performed for the memory cell array 204 using the sense amplifier 206, and these operations are performed by a memory controller, such as the memory controller 102. Accordingly, the timing diagram 300 is described in the following sections with respect to memory controller 102, which performs pre-charging and sensing operations in the memory cell array 204 using the sense amplifier 206. The timing diagram 300 represents one access cycle to perform pre-charging and sensing operations for the memory cell array 204. The access cycle can include multiple stages to perform pre-charging and sensing operations. The stages can be performed sequentially in the stated order.

In the timing diagram 300 (and in all other timing diagrams described in this specification), the X-axis represents time and the Y-axis represents voltage level. As shown by the timing diagram 300, before time Ta, all nodes N1, N2, N3, N6, N11, $N_{SEN}$, $N_{COM}$ and $N_{BLI}$ (which are described in FIG. 2) maintain respective default voltage levels. In some implementations, the default voltage levels for the nodes N1, N2, N3, N6, N11, $N_{SEN}$, $N_{COM}$ and $N_{BLI}$ are set to a same voltage level, e.g., 0 volts (V). In some other implementations, the default voltage levels for these nodes are set to different voltage levels.

The memory controller performs pre-charging operations between time Ta and time Td. Between the time Ta and time Tb, the memory controller increases a voltage level of the bit line clamping signal BLC2 such that a voltage level at the node N2 increases. At the time Tb, the node N2 is charged to a voltage level V2. When the voltage level V2 is higher than the threshold voltage of the transistor M2, the transistor M2 is turned on such that the voltage VPW1 is provided from the node N4 to the node $N_{COM}$. Thus, a voltage level at the node $N_{COM}$ increases between the time Ta and the time Tb. In this example, the node $N_{COM}$ is charged to a voltage level V7 at the time Tb.

Between the time Ta and the time Tb, the memory controller increases a voltage level of the bit line clamping signal BLC1 such that a voltage level at the node N1 increases. At the time Tb, the node N1 is charged to a voltage level V1. When the voltage level V1 is higher than the threshold voltage of the transistor M1, the transistor M1 is turned on such that the voltage at the node $N_{COM}$ is provided to the node $N_{BLI}$. Thus, a voltage level at the node $N_{BLI}$ increases between the time Ta and the time Tb. In this example, the node $N_{BLI}$ is charged to a voltage level V8 at time Tb.

Between the time Ta and the time Tb, the memory controller increases a voltage level of the setting signal SET such that a voltage level at the node N6 increases. At the time Tb, the node N6 is charged to a voltage level V4. Where the voltage level V4 fully turns on the transistor MS, the voltage VPW2 is provided from the node N5 to the node $N_{SEN}$. Thus, a voltage level at the node $N_{SEN}$ increases between the time Ta and the time Tb, with $N_{SEN}$ being pre-charged through MS during the time period between Ta and Tb. In this example, the node $N_{SEN}$ is charged to a voltage level V6 at the time Tb.

Between the time Ta and the time Tb, the memory controller maintains respective default voltage levels at the nodes N3 and N11. When the default voltage level at the node N3 is lower than the threshold voltage of the transistor M3, the transistor M3 is turned off such that the voltage at the node $N_{SEN}$ is not provided at the node $N_{COM}$.

Between the time Tb and a time Tc, the memory controller decreases the voltage at the node N6 from the voltage level V4 to a default voltage level such that the capacitor C1 is fully charged, but not overcharged. In some implementations, the capacitor C1 is fully charged at the time Tc.

At the time Tc, the memory controller provides the clock signal PCLK to the node N11, and C1 is boosted by PCLK at the time Tc. Where a peak of the clock signal PCLK is at voltage level V5, the voltage at the node $N_{SEN}$ is increased from the voltage level V6 to a voltage level V6' by the voltage level V5. That is, the voltage difference between the node $N_{SEN}$ and the node N11 is maintained by the capacitor C1, the voltage at the node $N_{SEN}$ is increased as the voltage at the node N11 is increased by the clock signal PCLK.

The memory controller performs sensing operations between the time Td and a time Te. The memory controller starts sensing at time Td and stops sensing at time Te, and at time Tf boosts down the node $N_{SEN}$. At time Td, the node $N_{SEN}$ is charged to voltage level V6'. However, at the time Td, the voltage V6' is not yet provided to the memory cell array 204 because the memory controller has not turned on the transistor M3 by maintaining a default voltage level at the node N3 using the bit line clamping signal BLC3.

As described above, while pre-charging operations are performed between time Ta and time Td, the node $N_{BLI}$ is charged to the voltage V8. When the memory controller turns on the transistor MB using the bit line signal BLS, the voltage V8 is provided to the memory cell array 204. In particular, the sensing current $I_{SEN}$ corresponding to the voltage V8 is provided from the sense amplifier 206 to the memory cell array 204. The sensing current $I_{SEN}$ provides the cell current $I_{CELL}$ to the cell string and the charging current $I_{CH}$ to the metal bit line parasitic capacitance $C_{MBL}$. The cell current $I_{CELL}$ pre-charges one or more cells coupled to the cell string through one or more word lines such that the one or more cells can be charged to a target pre-charging voltage level. The charging current $I_{CH}$ pre-charges the capacitance $C_{MBL}$ such that the capacitance $C_{MBL}$ can have a target pre-charging voltage level.

Between the time Td and the time Te, the memory controller maintains the voltage at the node N2 at the voltage level V2. The transistor M2 is turned off such that a voltage V2–Vgs(M2) is provided to the node $N_{COM}$ through the transistor M2, where Vgs(X) refers to the gate-to-source voltage of transistor X. In addition, between the time Td and the time Te, the memory controller increases voltage at the node N3 to the voltage V3 using the bit line clamping signal BLC3. Where the voltage at the node N3 becomes higher than the threshold voltage of the transistor M3, the transistor M3 is turned on such that the voltage V3–Vgs(M3) is provided to the node $N_{COM}$ by the transistor M3. Thus, compared to a time period between the time Ta and the time Td, an additional voltage, i.e., the voltage provided from the node N3 through the transistor M3, is provided to the node $N_{COM}$ between the time Td and the time Te. This additional voltage causes the voltage at the node $N_{COM}$ being increased from the voltage level V7 to a voltage level V7'. Since the node $N_{COM}$ is coupled to the drain of the transistor M1, the voltage at the node $N_{BLI}$ is also increased from the voltage level V8 to a voltage level V8' as the voltage at the node $N_{COM}$ is increased from the voltage level V7 to the voltage level V7'. This voltage change at the node $N_{BLI}$ and a corresponding voltage change at node $N_{SEN}$ causes changes in the sensing current. After pre-charging setup, $I_{CH}$ is close to zero. However, due to the increase in the $N_{SEN}$ voltage level, $I_{CH}$ increase to charge up the capacitance $C_{MBL}$.

Figure 4:
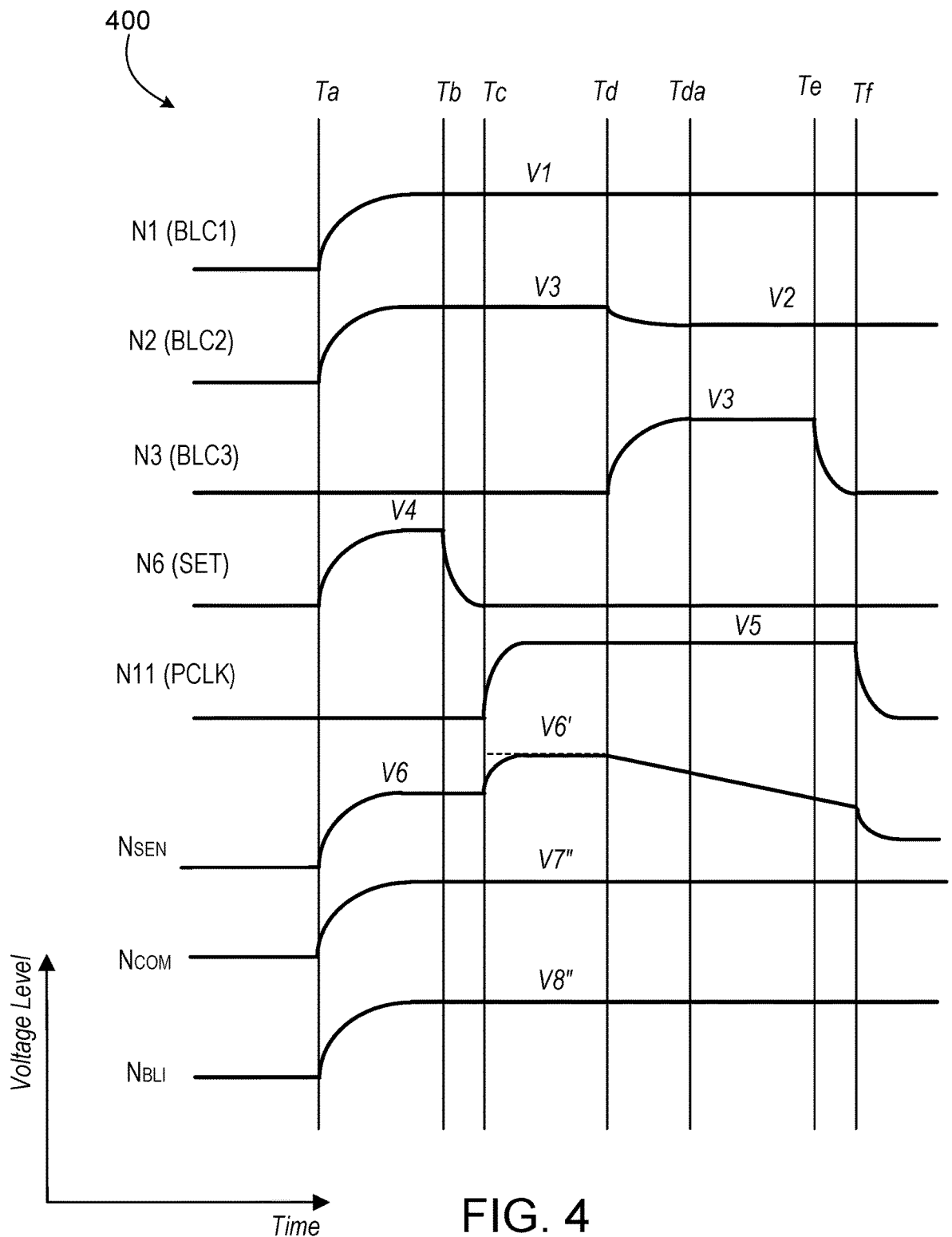
FIG. 4 illustrates a second example timing diagram to perform pre-charging and sensing operations to a memory cell array.

FIG. 4 illustrates a second example timing diagram 400 to perform pre-charging and sensing operations to a memory cell array. In some implementations, the pre-charging and sensing operations indicated by the timing diagram 400 is performed for the memory cell array 204 using the sense amplifier 206, and these operations are performed by a memory controller, such as the memory controller 102. Accordingly, the timing diagram 400 is described in the following sections with respect to memory controller 102, which performs pre-charging and sensing operations in the memory cell array 204 using the sense amplifier 206. The timing diagram 400 represents one access cycle for performing pre-charging and sensing operations for the memory cell array. The access cycle can include multiple stages to perform pre-charging and sensing operations. The stages can be performed sequentially in the stated order. In some implementations, the timing diagram 400 is similar to the timing diagram 300, except for the following differences. In some implementations, the timing diagram 400 indicates improved the memory access operation, compared to the timing diagram 300, by decreasing the voltage variation at node $N_{COM}$ between the metal bit line setup (pre-charging) stage and the sensing stage.

The memory controller performs pre-charging operations between the time Ta and the time Tb. In this time period, the memory controller controls the bit line clamping signal BLC2, e.g., increases a voltage level of the bit line clamping signal BLC2, such that voltage at the node N2 increases. At the time Tb, the node N2 is charged to a voltage level V3 that, in some implementations, is higher than the voltage level V2 described with reference to timing diagram 300. When the voltage level V3 is higher than the threshold voltage of the transistor M2, the transistor M2 is turned on to clamp the node $N_{COM}$ to voltage level V3–Vgs(M2). Thus, voltage at the node $N_{COM}$ increases between the time Ta and the time Tb, to a voltage level V3–Vgs(M2)=V7" at the time Tb. In some implementations, the voltage level V7" is higher than the voltage level V7 described with reference to timing diagram 300, because the voltage level V3 is higher than the voltage level V2.

Between the time Ta and the time Tb, the memory controller also controls the bit line clamping signal BLC1, e.g., increases a voltage level of the bit line clamping signal BLC1, such that voltage at the node N1 increases. At the time Tb, the node N1 is charged to a voltage level V1. When the voltage level V1 is higher than the threshold voltage of the transistor M1, the transistor M1 is turned on and clamps the node $N_{BLI}$ to voltage level V1–Vgs(M1). Thus, a voltage level at the node $N_{BLI}$ increases between the time Ta and the time Tb, to a voltage level V1–Vgs(M1)=V8" at time Tb, where V8" that is higher than the voltage level V8 described with reference to timing diagram 300.

The memory controller performs sensing operations between the time Td and the time Tf. Between the time Td and a time Tda, the memory controller maintains the voltage at the node N3 as the voltage level V3.

In some implementations, between the time Td and the time Tda, the memory controller decreases the voltage at the node N2 from the voltage level V3 to the voltage level V2, to turn off transistor M2. Accordingly, bias is provided from the node $N_{SEN}$ to the node $N_{COM}$ between the time Td and the time Tda as the transistor M3 is turned on in response to the bit line clamping signal BLC3 (which is also set to voltage level V3), thereby enabling node $N_{COM}$ to maintain the voltage level V7".

Since the node $N_{COM}$ is coupled to the drain of the transistor M1, the voltage at the node $N_{BLI}$ also maintains the voltage V8" between the time Td and the time Te. As a result, sensing current provided from the sense amplifier 206 to the memory cell array 204 is maintained between the time Td and the time Te. Compared to the example described with reference to FIG. 3, pre-charging and sensing operations performed based on the timing diagram 400 can reduce or substantially eliminate the voltage change at the node $N_{BLI}$ between the time Td and the time Te. Thus, the charging metal bit line parasitic capacitance current can be significantly reduced.

Figure 5:
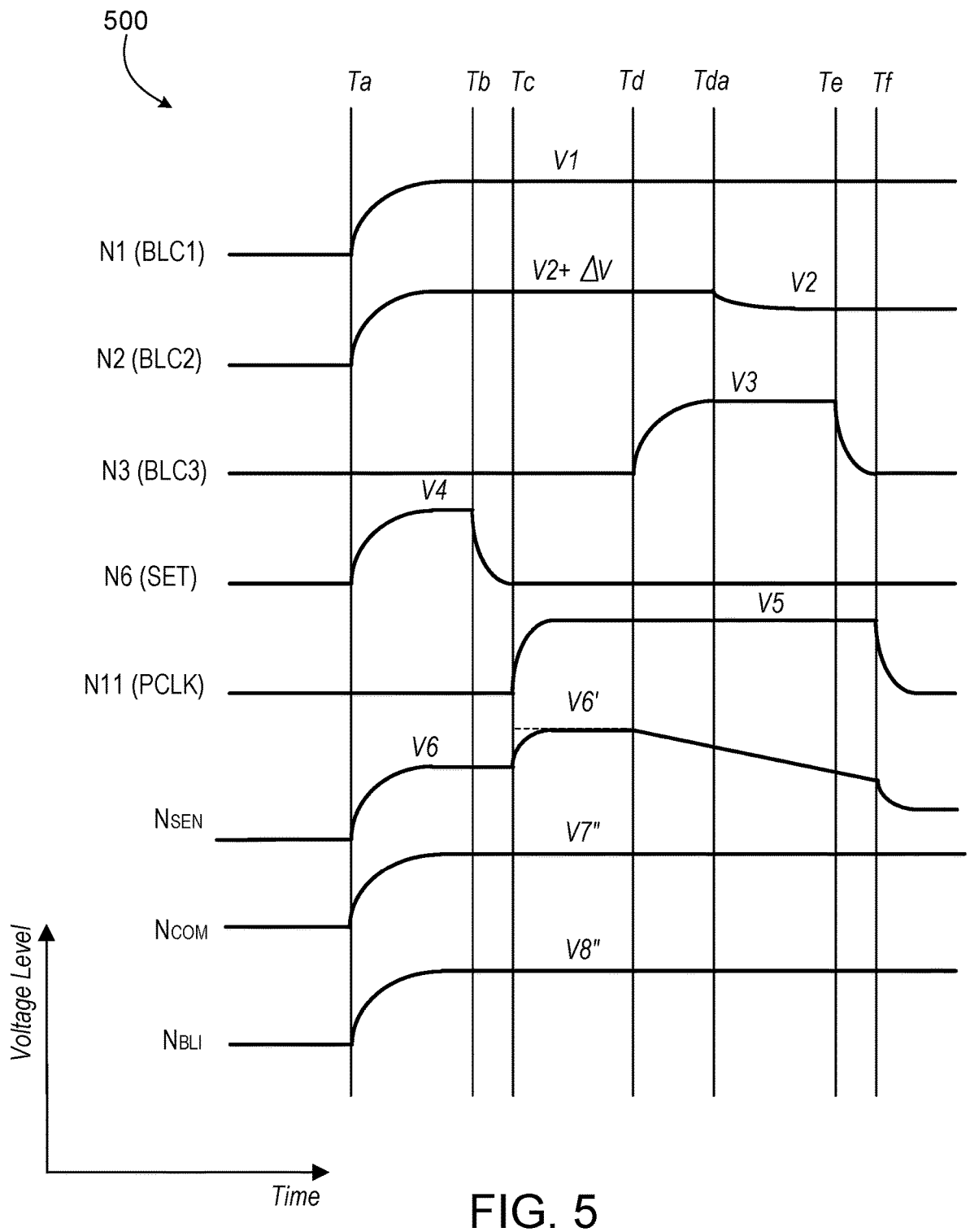
FIG. 5 illustrates a third example timing diagram to perform pre-charging and sensing operations to a memory cell array.

FIG. 5 illustrates a third example timing diagram 500 to perform pre-charging and sensing operations to a memory cell array. In some implementations, the pre-charging and sensing operations indicated by the timing diagram 500 is performed for the memory cell array 204 using the sense amplifier 206, and these operations are performed by a memory controller, such as the memory controller 102. Accordingly, the timing diagram 500 is described in the following sections with respect to a memory controller, e.g., memory controller 102, which performs pre-charging and sensing operations in the memory cell array 204 using the sense amplifier 206. The timing diagram 500 represents one memory access cycle for performing pre-charging and sensing operations to the memory cell array. For example, the memory access cycle can include multiple stages to perform pre-charging and sensing operations. The stages can be performed sequentially in the stated order. The timing diagram 500 is similar to the timing diagram 400, except for the following differences. In some implementations, the timing diagram 500 indicates improved the memory access operation, compared to the timing diagram 300, by decreasing the voltage variation at node $N_{COM}$ between the metal bit line setup (pre-charging) stage and the sensing stage.

The memory controller performs pre-charging operations between time Ta and time Tb. In this time period, the memory controller controls the bit line clamping signal BLC2, e.g., increases a voltage level of the bit line clamping signal BLC2, such that voltage at the node N2 increases. In some implementations, at the time Tb, the node N2 is charged to a voltage level V2+ΔV that is higher than the voltage level V2 shown in timing diagram 300 by an amount ΔV. In some implementations, ΔV is the difference between voltage level V3 shown in timing diagram 400, and voltage level V2 of timing diagram 300, e.g., V2+ΔV=V3. However, in other implementations, ΔV has a different value, e.g., incrementally greater than V2. In some implementations, ΔV is set to be a value such that the variation in the voltage level at node $N_{COM}$ is within a preset threshold value.

When V2+ΔV is higher than the threshold voltage of the transistor M2, the transistor M2 is turned on to clamp the node $N_{COM}$ to voltage level V2+ΔV−Vgs(M2). Thus, voltage at the node $N_{COM}$ increases between time Ta and time Tb, to a voltage level V7" at the time Tb. In these implementations, the voltage level V7" is greater than the voltage level V7, since voltage level V2+ΔV is greater than voltage level V2.

Between the time Ta and the time Tb, the memory controller also controls the bit line clamping signal BLC1, e.g., increases a voltage level of the bit line clamping signal BLC1, such that voltage at the node N1 increases. At the time Tb, the node N1 is charged to a voltage level V1. When the voltage level V1 is higher than the threshold voltage of the transistor M1, the transistor M1 is turned on and clamps the node $N_{BLI}$ to voltage level V1−Vgs(M1). Thus, voltage level at the node $N_{BLI}$ increases between the time Ta and the time Tb, to voltage level V8" at time Tb that is higher than the voltage level V8 of timing diagram 300.

The memory controller performs sensing operations between time Td and time Tf. Between time Td and time Tda, the memory controller controls the bit line clamping signal BLC3 to clamp the voltage at the node N3 to the voltage level V3.

Between time Tda and time Te, the memory controller decreases the voltage at the node N2 from the voltage level V2+ΔV to the voltage level V2, to turn off the transistor M2. Accordingly, bias is provided from the node $N_{SEN}$ to the node $N_{COM}$ between the time Td and the time Tda as the transistor M3 is turned on in response to the bit line clamping signal BLC3, thereby enabling node $N_{COM}$ to maintain the voltage level V7".

Since the node $N_{COM}$ is coupled to the drain of the transistor M1, the voltage at the node $N_{BLI}$ is maintained at voltage V8" between the time Td and the time Te. As a result, sensing current provided from the sense amplifier 206 to the memory cell array 204 is maintained between the time Td and the time Te. Compared to the timing diagram 300, the memory controller that performs pre-charging and sensing operations based on the timing diagram 500 can reduce or substantially eliminate the voltage change at the node $N_{BLI}$ between the time Td and the time Te. Thus, the charging metal bit line parasitic capacitance $C_{MBL}$ can be significantly reduced.

Figure 6:
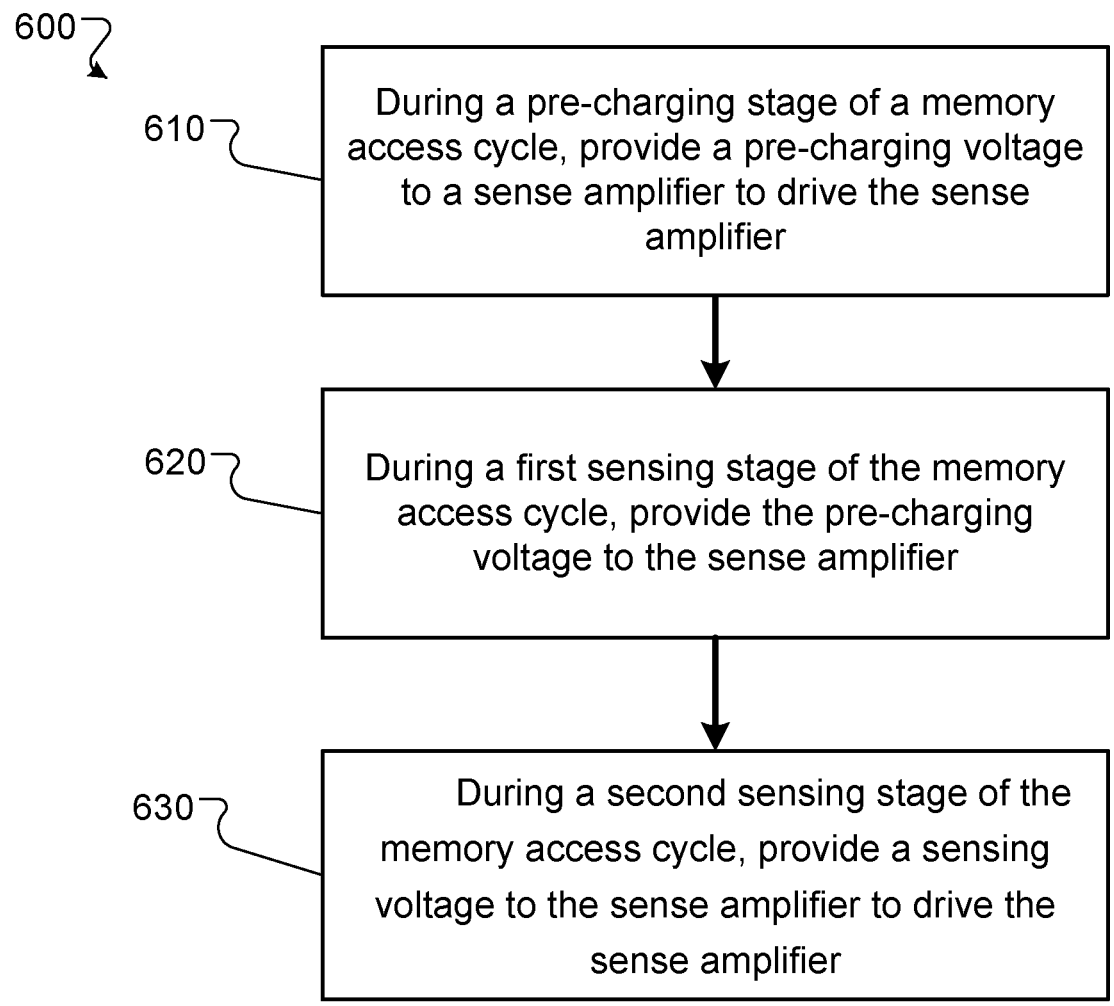
FIG. 6 illustrates an example flowchart for a method to perform pre-charging and sensing operations to a memory cell array.

FIG. 6 illustrates an example process 600 to perform pre-charging and sensing operations of a memory cell array. In some implementations, the process 600 is performed by a memory controller, e.g., memory controller 102, to perform pre-charge and sense operations for the memory cell array 204 using the sense amplifier 202. Accordingly, the following sections describe the process 600 with respect to the memory controller 102 accessing the memory cell array 204 using the sense amplifier 202. In other implementations, the process 600 can be performed by other memory controllers to access other memory cell arrays using different sense amplifiers.

In the process 600, during a pre-charging stage of a memory access cycle, a pre-charging voltage is provided to a sense amplifier of a memory device to drive the sense amplifier (610). In response to the pre-charging voltage, a particular voltage is provided to a memory cell array of the memory device. For example, as shown in timing diagram 400, the memory controller 102 provides a pre-charging voltage V3 to the sense amplifier 206 between time Ta and time Td. In response to the pre-charging voltage V3, the node $N_{BLI}$ is biased at voltage V8". The node $N_{BLI}$ voltage is provided to the node NS, and thus the memory cell array 204 is provided voltage V8" between time Tc and time Td.

During a first sensing stage of the memory access cycle, the pre-charging voltage is provided to the sense amplifier (620). For example, the memory controller 102 provides the pre-charging voltage V3 to the sense amplifier. In some implementations, the first sensing stage continues for several microseconds.

During a second sensing stage of the memory access cycle, a sensing voltage is provided to the sense amplifier to drive the sense amplifier (630). In doing so, the particular voltage provided to the memory cell array is maintained. In some implementations, the pre-charging voltage is higher than the sensing voltage. For example, the memory controller 102 provides a sensing voltage V2 to the sense amplifier 206 to drive the sense amplifier 206. In response to the sensing voltage V2, the voltage V8" is maintained and provided to the memory cell array between the time Tda and the time Te. In some implementations, the second sensing stage continues for several microseconds.

In some implementations, the pre-charging voltage is lower than the sensing voltage. In such implementations, the sensing voltage V2 provided to the sense amplifier is higher than the pre-charging voltage V3.

In some implementations, the memory cell array includes a capacitance circuit, e.g., the metal bit line parasitic capacitance $C_{MBL}$, and one or more memory cells in a memory cell string, e.g., the cell string 212, of the memory cell array. During the second sensing stage of the memory access cycle, the memory controller 102 controls the sense amplifier 206 to stop providing current to the metal bit line parasitic capacitance, e.g., $C_{MBL}$, while providing current to one or more memory cells of the corresponding cell string, e.g., cell string 212, of the memory cell array.

The disclosed and other examples can be implemented as one or more computer program products, for example, one or more modules of computer program operations encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, an operating system, or a combination of one or more of them.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

While this document describes many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
    a memory cell array that includes (i) a plurality of memory cells arranged in a cell string that is coupled to a metal bit line, and (ii) a capacitance circuit corresponding to the metal bit line;
    a sense amplifier for providing a sensing current to the memory cell array, the sense amplifier including a pre-charging unit and a sensing unit and configured to provide (i) a first current to one or more memory cells of the plurality of memory cells, and (ii) a second current to the capacitance circuit; and
    a memory controller for controlling the sense amplifier to provide the sensing current to one or more memory cells of the plurality of memory cells to access data from the one or more memory cells during a memory access cycle, the memory controller performing operations comprising:
        during a pre-charging stage of the memory access cycle, providing a pre-charging voltage to the sense amplifier by biasing a first transistor included in the pre-charging unit to a first voltage, the pre-charging voltage provided to drive the sense amplifier such that a particular voltage is provided to the memory cell array;
        during a first sensing stage of the memory access cycle, providing the pre-charging voltage to the sense amplifier; and
        during a second sensing stage of the memory access cycle, providing a sensing voltage to the sense amplifier by biasing the first transistor to a second voltage that is lower than the first voltage, enabling the sensing unit to provide the sensing voltage to drive the sense amplifier such that the particular voltage provided to the memory cell array is maintained,
    wherein the pre-charging unit is configured to generate the second current based on a first control signal and a second control signal that are received from the memory controller, and the sensing unit is configured to generate the first current based on a third control signal that is received from the memory controller,
    wherein the first transistor is configured to drive the first voltage based on the first control signal that is applied to a gate of the first transistor, and drive the second voltage based on an updated first control signal that is applied to the gate of the first transistor,
    wherein the pre-charging unit includes a second transistor that is configured to drive an additional voltage based on the second control signal applied to a gate of the second transistor,
    wherein the second current is generated based on the first voltage and the additional voltage.

2. The memory device of claim 1, wherein a sum of the first current and the second current is the sensing current.

3. The memory device of claim 1, wherein, during the pre-charging stage of the memory access cycle, the memory controller is configured to control the sense amplifier to provide the first current to the one or more memory cells of the plurality of memory cells and the second current to the capacitance circuit.

4. The memory device of claim 3, wherein, during the pre-charging stage of the memory access cycle, the one or more memory cells of the plurality of memory cells are pre-charged by the first current and the capacitance circuit is pre-charged by the second current.

5. The memory device of claim 1, wherein capacitance circuit includes a metal bit line parasitic capacitance.

6. The memory device of claim 1, wherein, during the second sensing stage of the memory access cycle, the memory controller is configured to control the sense amplifier to provide the first current to the one or more memory cells of the plurality of memory cells, and to stop providing the second current to the capacitance circuit.

7. The memory device of claim 6, wherein, during the second sensing stage of the memory access cycle, the first current is substantially the same as the sensing current.

8. The memory device of claim 1, wherein the sensing unit includes:
- a third transistor that is configured to drive a third voltage based on the third control signal that is applied to a gate of the third transistor,
- wherein the first current is generated based on the third voltage.

9. The memory device of claim 8, wherein the first voltage is equal to the third voltage.

10. The memory device of claim 1, wherein at least one of the pre-charging stage of the memory access cycle, the first sensing stage of the memory access cycle, or the second sensing stage of the memory access cycle continues for a preselected time period.

11. The memory device of claim 1, wherein the pre-charging voltage is between 0.5 volts and 1.5 volts, and wherein the sensing voltage is between 1 volt and 2 volts.

12. The memory device of claim 1, wherein the sensing current corresponds to the particular voltage provided from the sense amplifier to the memory cell array.

13. A method to program one or more memory cells of a memory device during a memory access cycle, the method comprising:
- during a pre-charging stage of the memory access cycle, providing, by a memory controller, a pre-charging voltage to a sense amplifier of the memory device by biasing a first transistor included in a pre-charging unit of the sense amplifier to a first voltage, wherein the sense amplifier is driven to provide a particular voltage to a memory cell array of the memory device,
- wherein driving the sense amplifier to provide the particular voltage to the memory cell array of the memory device comprises (i) providing a first current from the sense amplifier to one or more memory cells in a cell string of the memory cell array further, and (ii) providing a second current from the sense amplifier to a parasitic capacitance circuit corresponding to a metal bit line of the memory cell array that is coupled to the cell string;
- during a first sensing stage of the memory access cycle, providing, by the memory controller, the pre-charging voltage to the sense amplifier; and
- during a second sensing stage of the memory access cycle, providing, by the memory controller, a sensing voltage to the sense amplifier by biasing the first transistor to a second voltage that is lower than the first voltage, enabling a sensing unit of the sense amplifier to provide the sensing voltage, wherein the sense amplifier is driven to maintain the particular voltage provided to the memory cell array,
- wherein providing the first current and the second current comprises:
  - generating, using the sensing unit of the sense amplifier, the first current based on a third control signal applied by the memory controller to a gate of a third transistor of the sensing unit to drive a third voltage, and
  - generating, using the pre-charging unit of the sense amplifier, the second current based on (i) a first control signal applied by the memory controller to a gate of the first transistor to drive the first voltage and (ii) a second control signal applied by the memory controller to a gate of a second transistor of the pre-charging unit to drive an additional voltage.

14. The method of claim 13, further comprising:
- during the second sensing stage of the memory access cycle, controlling the sense amplifier to stop providing the second current to the parasitic capacitance circuit, and to provide the first current to the one or more memory cells,
- wherein the first current is substantially the same as the sensing current during the second sensing stage of the memory access cycle.

15. The method of claim 13, wherein the sensing current corresponds to the particular voltage provided from the sense amplifier to the memory cell array.

16. The method of claim 13, wherein at least one of the pre-charging stage of the memory access cycle, the first sensing stage of the memory access cycle, or the second sensing stage of the memory access cycle continues for a preselected time period.

17. The method of claim 13, wherein the first voltage is equal to the third voltage.

18. A memory device comprising:
- a memory cell array that includes (i) a plurality of memory cells arranged in a cell string that is coupled to a metal bit line, and (ii) a capacitance circuit corresponding to the metal bit line;
- a sense amplifier for providing a sensing current to the memory cell array, the sense amplifier including a pre-charging unit and a sensing unit and configured to provide (i) a first current to one or more memory cells of the plurality of memory cells, and (ii) a second current to the capacitance circuit; and
- a memory controller for controlling the sense amplifier to provide the sensing current to one or more memory cells of the plurality of memory cells to access data from the one or more memory cells during a memory access cycle, the memory controller performing operations comprising:
  - during a pre-charging stage of the memory access cycle, providing a pre-charging voltage to the sense amplifier by biasing a first transistor included in the pre-charging unit to a first voltage, the pre-charging voltage provided to drive the sense amplifier such that a particular voltage is provided to the memory cell array;
  - during a first sensing stage of the memory access cycle, providing the pre-charging voltage to the sense amplifier; and
  - during a second sensing stage of the memory access cycle, providing a sensing voltage to the sense amplifier by biasing the first transistor to a second voltage that is lower than the first voltage, enabling the sensing unit to provide the sensing voltage to drive the sense amplifier such that the particular voltage provided to the memory cell array is maintained,
- wherein the pre-charging unit is configured to generate the second current based on a first control signal and a second control signal that are received from the memory controller, and
- the sensing unit is configured to generate the first current based on a third control signal received from the memory controller that is applied to a gate of a third transistor in the sensing unit to drive a third voltage, wherein the third voltage is equal to the first voltage.

19. The memory device of claim 18, wherein a sum of the first current and the second current is the sensing current.

20. The memory device of claim 18, wherein, during the pre-charging stage of the memory access cycle, the memory controller is configured to control the sense amplifier to provide the first current to the one or more memory cells of the plurality of memory cells and the second current to the capacitance circuit.

21. The memory device of claim 20, wherein, during the pre-charging stage of the memory access cycle, the one or more memory cells of the plurality of memory cells are pre-charged by the first current and the capacitance circuit is pre-charged by the second current.

22. The memory device of claim 18, wherein capacitance circuit includes a metal bit line parasitic capacitance.

23. The memory device of claim 18, wherein, during the second sensing stage of the memory access cycle, the memory controller is configured to control the sense amplifier to provide the first current to the one or more memory cells of the plurality of memory cells, and to stop providing the second current to the capacitance circuit.

* * * * *